US012804850B2

(12) United States Patent
Wu

(10) Patent No.: US 12,804,850 B2
(45) Date of Patent: Nov. 17, 2026

(54) IMMERSION COOLING MODULE, MULTILAYERED IMMERSION COOLING SYSTEM, AND METHOD THEREOF

(71) Applicant: ETI CA BATTERY INC., New Taipei City (TW)

(72) Inventor: Wei-Chen Wu, New Taipei City (TW)

(73) Assignee: ETI CA BATTERY INC., New Taipei City (TW)

(*) Notice: Subject to any disclaimer, the term of this patent is extended or adjusted under 35 U.S.C. 154(b) by 224 days.

(21) Appl. No.: 18/932,744

(22) Filed: Oct. 31, 2024

(65) Prior Publication Data

US 2026/0075760 A1 Mar. 12, 2026

(30) Foreign Application Priority Data

Sep. 11, 2024 (TW) ................................ 113134462

(51) Int. Cl.
*H05K 7/20* (2006.01)

(52) U.S. Cl.
CPC ..... *H05K 7/20272* (2013.01); *H05K 7/20236* (2013.01)

(58) Field of Classification Search
CPC .......................... H05K 7/20236; H10W 40/30
See application file for complete search history.

(56) References Cited

FOREIGN PATENT DOCUMENTS

| | | | | |
|---|---|---|---|---|
| JP | 2023-29880 | A | | 3/2023 |
| TW | M646757 | U | * | 10/2023 |
| WO | WO 2023/222345 | A1 | | 11/2023 |

* cited by examiner

*Primary Examiner* — Joel M Attey
*Assistant Examiner* — Khaled Ahmed Ali Al Samiri
(74) *Attorney, Agent, or Firm* — Birch, Stewart, Kolasch & Birch, LLP

(57) ABSTRACT

The disclosure describes an immersion cooling module, a multilayered immersion cooling system, and a method thereof. The immersion cooling module includes a main tank and an overflow plate. The partition divides the main tank into a liquid storage tank and a temporary storage tank. The top of the liquid storage tank is provided with a liquid inlet. The liquid storage tank may accommodate a cooling liquid and a module to be cooled. The bottom of the temporary storage tank is provided with a liquid outlet. The overflow plate is arranged in the main tank. When the top of the cooling liquid is higher than that of the overflow plate, the cooling liquid flows from the liquid storage tank to the temporary storage tank over the top of the overflow plate, and finally discharges from the liquid outlet, thereby generating the flow of the cooling liquid.

20 Claims, 11 Drawing Sheets

1A

IMMERSION COOLING MODULE, MULTILAYERED IMMERSION COOLING SYSTEM, AND METHOD THEREOF

This application claims priority for the TW Application No. 113134462 filed on 11 Sep. 2024, the content of which is incorporated by reference in its entirely.

BACKGROUND OF THE INVENTION

Field of the Invention

The present invention relates to a cooling system and a method thereof for cooling electronic equipment, particularly to an immersion cooling module, a multilayered immersion cooling system, and a method thereof.

Description of the Related Art

The conventional immersion cooling system is used to dissipate the heat of electronic equipment (i.e., modules to be cooled) that is directly immersed in a cooling liquid. Generally, a large cooling tank is set up and a cooling liquid with lower temperature is injected into the cooling tank. When the electronic equipment generates heat during operation, the heat will be transferred to the surrounding cooling liquid. The temperature of the cooling liquid can be made uniform based on the convection or stirring of the cooling liquid, thereby reducing the temperature of the electronic equipment to achieve a heat dissipation effect, especially in data centers and high-performance computer equipment. Because the immersion cooling system can directly contact the heat source, it can provide efficient heat dissipation without traditional large heat sinks or fan systems. The overall structure can be more compact. However, the conventional immersion cooling system is difficultly repaired for large electronic equipment. If the large electronic equipment needs to be repaired, the entire equipment must be lifted by a crane. The entire rack must be hung out of the cooling tank. It does not replace or repair internal parts and modules until the cooling liquid is drained.

To overcome the abovementioned problems, the present invention provides an immersion cooling module, a multilayered immersion cooling system, and a method thereof, so as to solve the afore-mentioned problems of the prior art.

SUMMARY OF THE INVENTION

The present invention provides an immersion cooling module, a multilayered immersion cooling system, and a method thereof, which cool the modules to be cooled. The so-called modules to be cooled include electronic equipment, devices or modules of the same type or different types. The present invention can be easily assembled and expanded. When applied to equipment that cools multiple modules, one of the modules can be repaired independently without affecting the cooling effect of other modules. The present invention can facilitate the maintenance and expansion of the cooling space and improve the flowing efficiency of a cooling liquid.

In order to achieve the foregoing objectives, the present invention provides an immersion cooling module that includes a main tank and an overflow plate. The main tank has a tank bottom, a partition, a first sidewall, and a second sidewall. The first sidewall and the second sidewall are connected to the tank bottom. The bottom of the partition is connected to the tank bottom. The partition is connected to the first sidewall. The partition divides the main tank into a liquid storage tank and a temporary storage tank. The top of the liquid storage tank is provided with a liquid inlet. The liquid storage tank is configured to accommodate a cooling liquid and a module to be cooled. The bottom of the temporary storage tank is provided with a liquid outlet. The overflow plate is arranged in the main tank. The bottom of the overflow plate is connected to the tank bottom. One side of the overflow plate is connected to the partition and another side of the overflow plate is connected to the second sidewall. The height of the overflow plate is lower than that of the partition. The liquid inlet is configured to inject the cooling liquid into the liquid storage tank. When the top of the cooling liquid is higher than the top of the overflow plate, the cooling liquid overflows from the liquid storage tank to the temporary storage tank along the top of the overflow plate and finally discharges from the liquid outlet.

In an embodiment of the present invention, the immersion cooling module further includes an inlet pipe. One end of the inlet pipe is connected to the liquid inlet. The inlet pipe is configured to transport the cooling liquid into the liquid storage tank.

In an embodiment of the present invention, the immersion cooling module further includes a top cover arranged above the main tank and configured to shield a part of the liquid storage tank or the temporary storage tank. The inlet pipe is arranged on the top cover.

In an embodiment of the present invention, the partition includes a bottom board, a first side board, and a second side board. The bottom board extends in a direction parallel to the tank bottom and connects to the first sidewall and the first side board. The first side board extends in a direction vertical to the tank bottom. One side of the first side board connects to the first sidewall. The bottom of the first side board connects to the bottom board. The second side board is adjacent to the first side board. The second side board extends in a direction vertical to the tank bottom. One side of the second side board connects to the first side board. The bottom of the second side board connects to the tank bottom. The liquid storage tank includes a first liquid storage region and a second liquid storage region that communicates with the first liquid storage region. The first liquid storage region communicates with the liquid inlet. The first liquid storage region is located over the temporary storage tank. The temporary storage tank separates from the first liquid storage region by the partition. The second liquid storage region is close to the overflow plate. The bottom of the second liquid storage region is the tank bottom.

In an embodiment of the present invention, a multilayered immersion cooling system includes a plurality of the immersion cooling modules stacked from bottom to top. The main tanks respectively have an opening that face the same direction and respectively accommodate a module to be cooled. The liquid outlet of the upper immersion cooling module is connected to the liquid inlet of the lower immersion cooling module. The cooling liquid flows from the upper immersion cooling module to the lower immersion cooling module. The cooling liquid continuously flows.

In an embodiment of the present invention, the multilayered immersion cooling system further includes a liquid reservoir and a liquid channel. The liquid reservoir is arranged under the immersion cooling modules. The liquid outlet of the lower the immersion cooling module faces the liquid reservoir for the cooling liquid to flow in. The liquid channel is arranged outside each of the immersion cooling modules. One end of the liquid channel is connected to the liquid reservoir and another end of the liquid channel is connected to the liquid inlet of the upper immersion cooling module.

In an embodiment of the present invention, the multilayered immersion cooling system further includes a driving device arranged outside each of the immersion cooling modules, connected to the liquid channel, and configured to drive the cooling liquid to achieve the circulation of the cooling liquid.

In an embodiment of the present invention, an immersion cooling method includes: providing the multilayered immersion cooling system; respectively arranging modules to be cooled in the liquid storage tanks of the multilayered immersion cooling system; and injecting a cooling liquid into the liquid inlet of the upper the immersion cooling module, thereby guiding the cooling liquid to flow from the upper immersion cooling module to the lower immersion cooling module and to continuously flow.

In an embodiment of the present invention, in the upper immersion cooling module, the cooling liquid flows into the liquid storage tank from the liquid inlet and overflows along the overflow plate down to the liquid outlet of the temporary storage tank. The cooling liquid flows out from the liquid outlet of the upper immersion cooling module and then flows into the liquid inlet of the lower immersion cooling module. The cooling liquid flows into the liquid storage tank and overflows along the overflow plate down to the liquid outlet of the temporary storage tank. Each of the modules to be cooled is submerged in the cooling liquid to generate the flow of the cooling liquid.

To sum up, the immersion cooling module, the multilayered immersion cooling system, and the method thereof can be applied to electronic equipment of various sizes. When repairing a single module of electronic equipment, the present invention can simplify the repair process, thereby reducing maintenance costs, improving repair work efficiency, and improving cooling efficiency. In addition, when the overall system needs to be expanded, the present invention can quickly and conveniently assemble and expand the architecture of the multilayered immersion cooling system, effectively applied to cool electronic devices of various types and configurations.

Below, the embodiments are described in detail in cooperation with the drawings to make easily understood the technical contents, characteristics and accomplishments of the present invention.

DETAILED DESCRIPTION OF THE INVENTION

Figure 1:
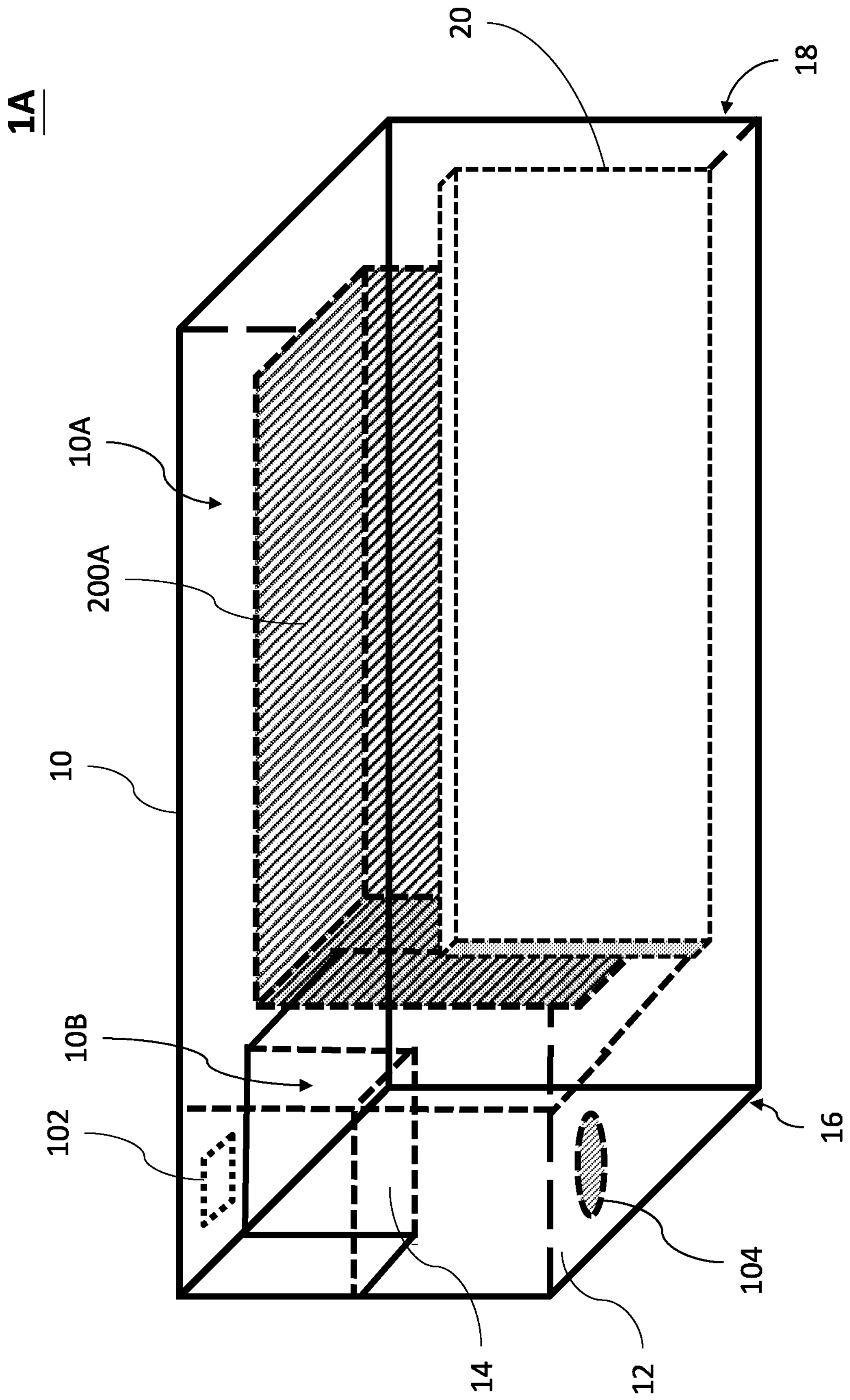
FIG. 1 is a schematic diagram illustrating an immersion cooling module according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Please refer to FIG. 1. The immersion cooling module 1A of the present invention is used to cool a module 200A to be cooled. The so-called "module to be cooled" can include electronic equipment, devices or modules of the same type or different types, such as lithium-ion batteries, servers, and high energy-consuming equipment. The immersion cooling module 1A includes a main tank 10 and an overflow plate 20. The main tank 10 has a tank bottom 12, a partition 14, a first sidewall 16, and a second sidewall 18. The first sidewall 16 and the second sidewall 18 are connected to the tank bottom 12. The bottom of the partition 14 is connected to the tank bottom 12. The partition 14 is connected to the first sidewall 16. The partition 14 divides the main tank 10 into a liquid storage tank 10A and a temporary storage tank 10B. The top of the liquid storage tank 10A is provided with a liquid inlet 102. The liquid storage tank 10A is configured to accommodate a cooling liquid and the module 200A to be cooled. The bottom of the temporary storage tank 10B is provided with a liquid outlet 104. The overflow plate 20 is arranged in the main tank 10. The bottom of the overflow plate 20 is connected to the tank bottom 12. One side of the overflow plate 20 is connected to the partition 14 and another side of the overflow plate 20 is connected to the second sidewall 18. The height of the overflow plate 20 is lower than that of the partition 14. The liquid inlet 102 is configured to inject the cooling liquid into the liquid storage tank 10A. When the top of the cooling liquid is higher than the top of the overflow plate 20, the cooling liquid flows from the liquid storage tank 10A to the temporary storage tank 10B over the top of the overflow plate 20, and finally discharges from the liquid outlet 104.

It is worth noted that the heights of the main tank 10 and the overflow plate 20 are greater than the height of the module 200A to be cooled. As a result, when the cooling liquid in the liquid storage tank 10A is endlessly injected into the liquid storage tank 10A, the module 200A to be cooled can be completely submerged in the cooling liquid to absorb the heat dissipated by the module 200A to be cooled. Once the top of the cooling liquid is higher than the top of the overflow plate 20, the cooling liquid will flow to the temporary storage tank 10B over the overflow plate 20. At this time, since there is a liquid outlet 104 on the bottom of the temporary storage tank 10B, the cooling liquid will be discharged downward from the liquid outlet 104, such that the cooling liquid inside the immersion cooling module 1A flows to achieve better heat dissipation and cooling effects. The immersion cooling module 1A can be used to cool various electronic equipment, devices or modules that are suitable for immersion cooling. The following description continues to explain that the immersion cooling module can be expanded with the number of modules to be cooled, which can correspond to other features of the overall cooling architecture that can be expanded immediately.

Figure 2:
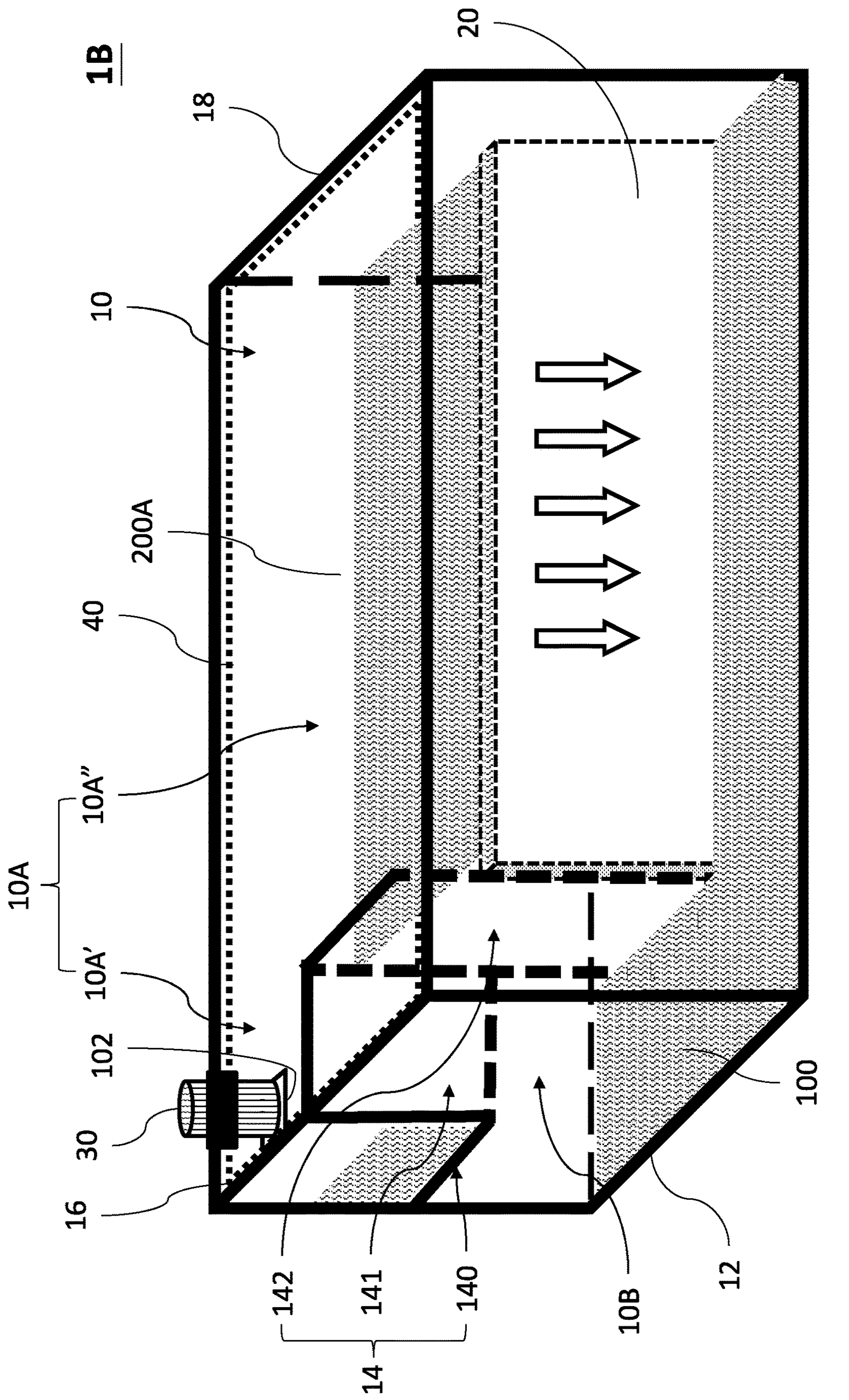
FIG. 2 is a schematic diagram illustrating an immersion cooling module according to another embodiment of the present invention.

Please refer to FIG. 2. The embodiment is different from the first embodiment in an inlet pipe 30, a top cover 40, the partition 14, and the liquid storage tank 10A. Although the module 200A to be cooled and the liquid outlet 104 are not shown in FIG. 2, a person with ordinary knowledge can also understand the features of this embodiment from the schematic diagram of FIG. 1 in order to make the drawing complete.

One end of the inlet pipe 30 is connected to the liquid inlet 102. The inlet pipe 30 is configured to transport the cooling liquid into the liquid storage tank 10A. The top cover 40 is arranged above the main tank 10 and configured to shield a part of the liquid storage tank 10A or the temporary storage tank 10B. The inlet pipe 30 is arranged on the top cover 40. When the top cover 40 does not completely seal the main tank 10, the cooling liquid 100 will not leak. Therefore, the top cover 40 allows the inlet pipe 30 to be installed stably. The multiple immersion cooling modules 1B are stacked layer by layer, which is helpful in adjusting the height of the inlet pipe 30 so that the inlet pipe 30 can be easily connected to other components. When the immersion cooling system 1B is not sealed, the structure of the overflow plate 20 and the liquid outlet 104 of the temporary storage tank 10B can effectively guide the cooling liquid 100 to be discharged, thereby preventing the cooling liquid 100 from overflowing to the exterior of the liquid storage tank 10A. As shown in FIG. 2, the direction of the arrow represents the flow direction of the cooling liquid 100 overflowing down along the overflow plate 20, and the wavy pattern represents the cooling liquid 100. When the top of the cooling liquid 100 is higher than the top of the overflow plate 20, the cooling liquid 100 flows to the temporary storage tank 10B over the overflow plate 20. The cooling liquid 100 is then discharged downward from the liquid outlet 104, so that the cooling liquid inside the immersion cooling module 1B can flow smoothly.

The partition 14 includes a bottom board 140, a first side board 141, and a second side board 142. The bottom board 140 extends in a direction parallel to the tank bottom 12 and connects to the first sidewall 16 and the first side board 141. The first side board 141 extends in a direction vertical to the tank bottom 12. One side of the first side board 141 connects to the first sidewall 16. The bottom of the first side board 141 connects to the bottom board 140. The second side board 142 is adjacent to the first side board 141. The second side board 142 extends in a direction vertical to the tank bottom 12. One side of the second side board 142 connects to the first side board 141. The bottom of the second side board 142 connects to the tank bottom 12.

The liquid storage tank 10A may include a first liquid storage region 10A' and a second liquid storage region 10A" that communicates with the first liquid storage region 10A'. The first liquid storage region 10A' communicates with the liquid inlet 102. The first liquid storage region 10A' is located over the temporary storage tank 10B. The temporary storage tank 10B separates from the first liquid storage region 10A' by the bottom board 140 of the partition 14, such that the cooling liquid is injected into the first liquid storage region 10A' rather than into the temporary storage tank 10B when flowing in. The second liquid storage region 10A" is close to the overflow plate 20. The bottom of the second liquid storage region 10A" is the tank bottom 12. Generally, the second liquid storage area 10A" is used to place the module 200A to be cooled, and the first liquid storage area 10A' is used to receive the injected cooling liquid. If necessary, the first liquid storage area 10A' can be alternatively used to place the module 200A to be cooled.

Figure 3:
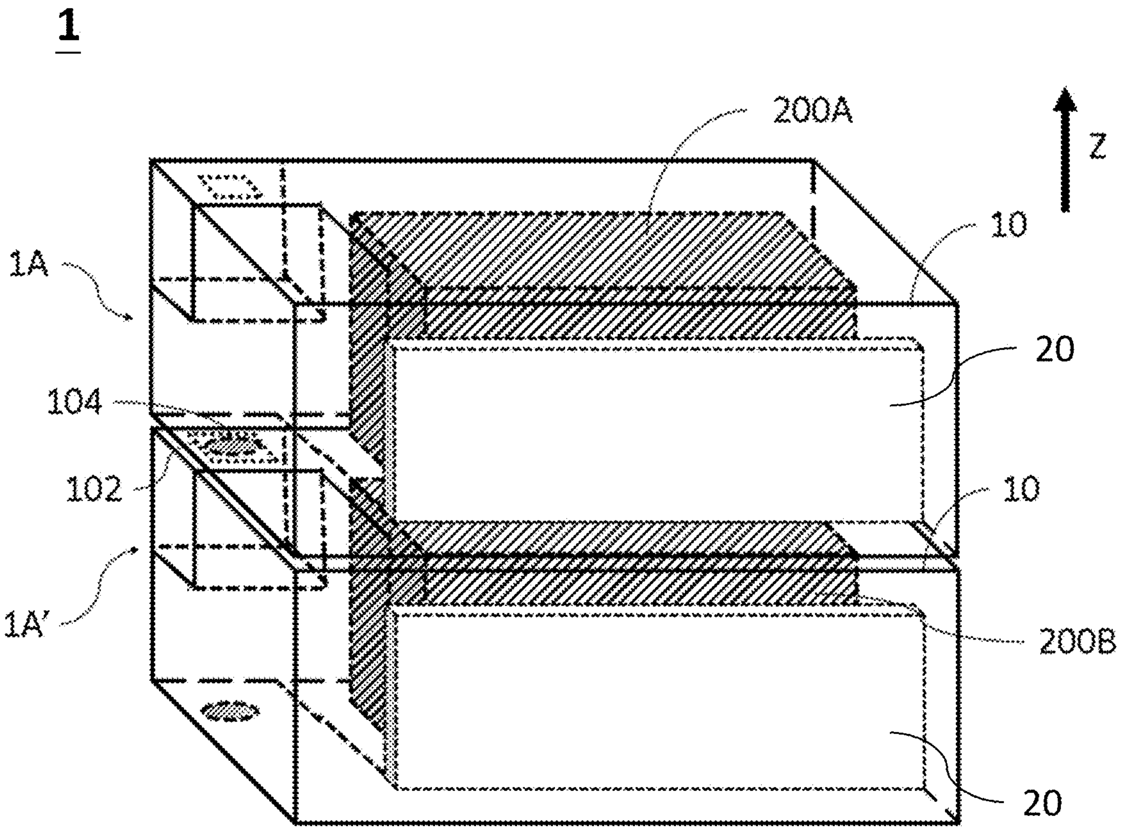
FIG. 3 is a schematic diagram illustrating a multilayered immersion cooling system according to a first embodiment of the present invention.

Please refer to FIG. 3. The multilayered immersion cooling system 1 includes a plurality of immersion cooling modules. As mentioned above, the immersion cooling module can be the immersion cooling module 1A or 1B of the foregoing embodiment. For ease of understanding, the immersion cooling module is exemplified by symbols 1A and 1A' in FIG. 3. 1A represents the upper immersion cooling module, 1A' represents the lower immersion cooling module, and the immersion cooling module 1A is actually the same architecture as the immersion cooling module 1A'. The openings of the main tanks 10 of the immersion cooling modules 1A and 1A' are all stacked in the same direction Z. The liquid storage tanks 10A respectively accommodate the modules to be cooled respectively (indicated as 200A and 200B in FIG. 3). For the two adjacent immersion cooling modules 1A and 1A', the liquid outlet 104 of the upper immersion cooling module 1A is connected to the liquid inlet 102 of the lower immersion cooling module 1A', so that the cooling liquid flows from the upper immersion cooling module 1A to the lower immersion cooling module 1A' and continuously flows.

In order to identify the positions of the liquid inlet 102 and the liquid outlet 104, they are presented in different shapes and sizes in FIG. 3. However, the liquid inlet 102 and the liquid outlet 104 can be actually implemented with openings of similar size or matching openings according to the requirements, so as to guide the outflow and inflow of the cooling liquid.

Figure 4A:
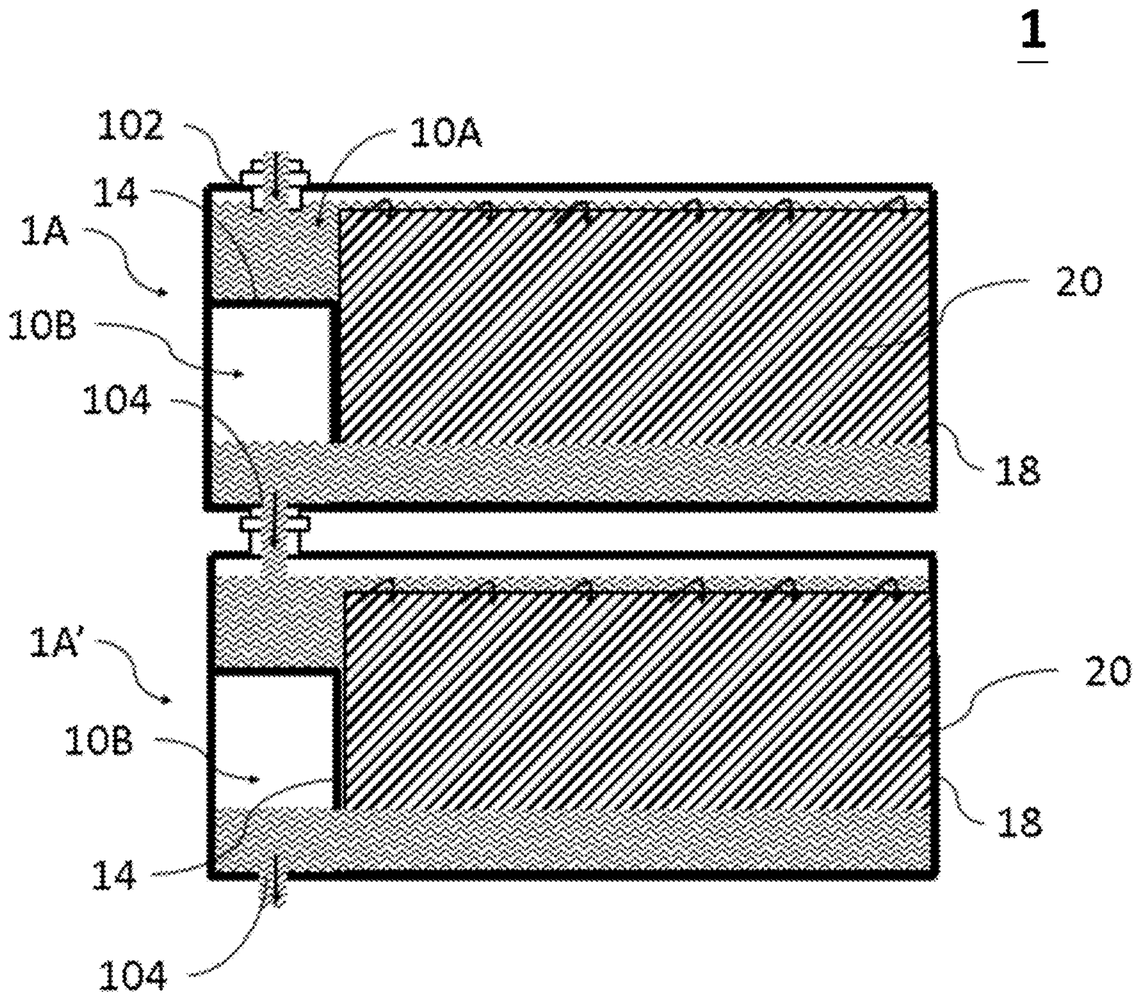
FIG. 4A and FIG. 4B are respectively a side view and a top view of the multilayered immersion cooling system according to the first embodiment of the present invention.
Figure 4B:
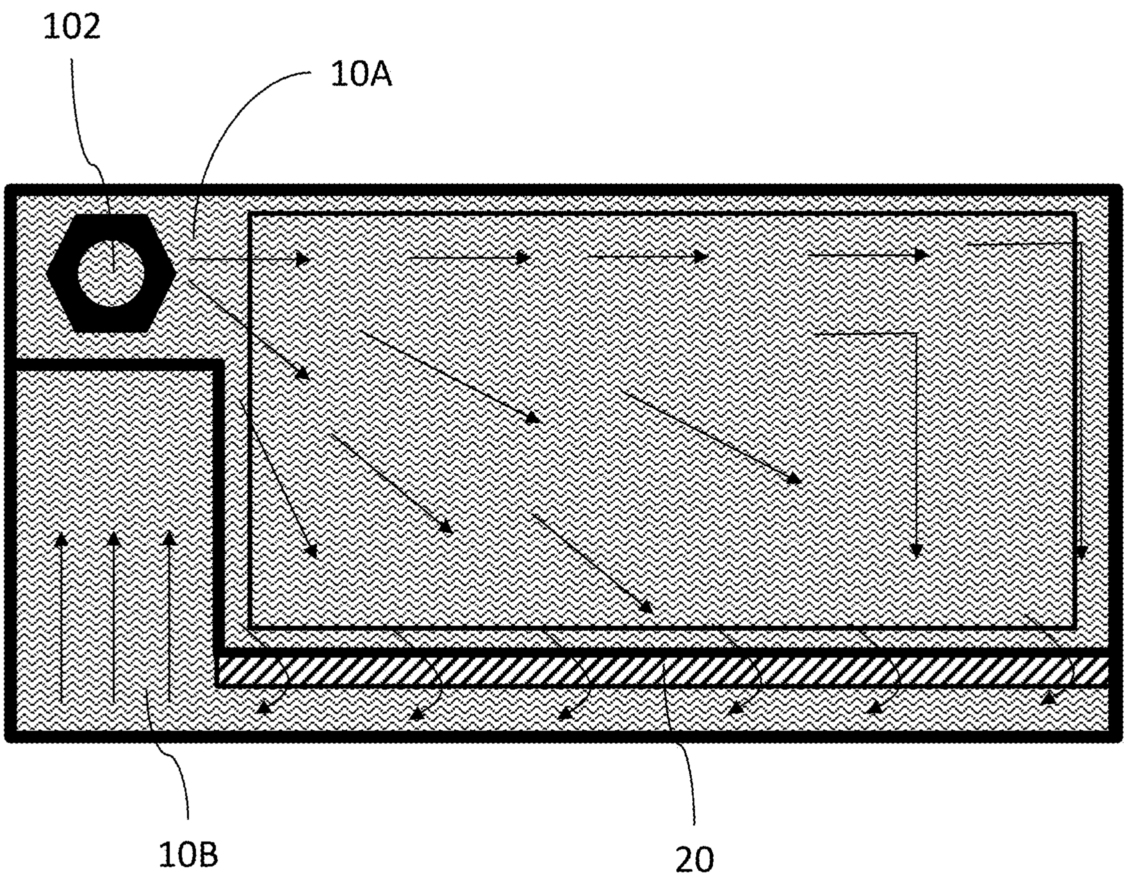

Please refer to FIGS. 4A and 4B to further illustrate the flowing direction of the cooling liquid. FIG. 4A is a side view of the flow of the cooling liquid of the multilayered immersion cooling system. FIG. 4B is a top view of the flow of the cooling liquid of the multilayered immersion cooling system. The direction of the arrow in the drawing represents the flow direction of the cooling liquid and the gray area represents the cooling liquid. As shown in FIGS. 4A and 4B, the cooling liquid is injected into the liquid inlet 102 of the upper immersion cooling module 1A. The cooling liquid is directed from the upper immersion cooling module 1A to the lower immersion cooling module 1A' so that the cooling liquid can flow continuously. The cooling liquid flows into the liquid storage tank 10A from the liquid inlet 102. When the top of the cooling liquid is higher than the top of the overflow plate 20, the cooling liquid flows from the liquid storage tank 10A to the temporary storage tank 10B over the top of the overflow plate 20 and finally discharges from the liquid outlet 104.

Both sides of the overflow plate 20 respectively connect to the partition 14 and the second sidewall 18. The height of the overflow plate 20 may be lower than the heights of the partition 14 and the second sidewall 18. Accordingly, the cooling liquid will not overflow to the outside of the liquid storage tank 10A when the cooling liquid flows from the liquid storage tank 10A to the temporary storage tank 10B. Thus, the surrounding environment of the multilayered immersion cooling system 1 can be kept clean.

Figure 5:
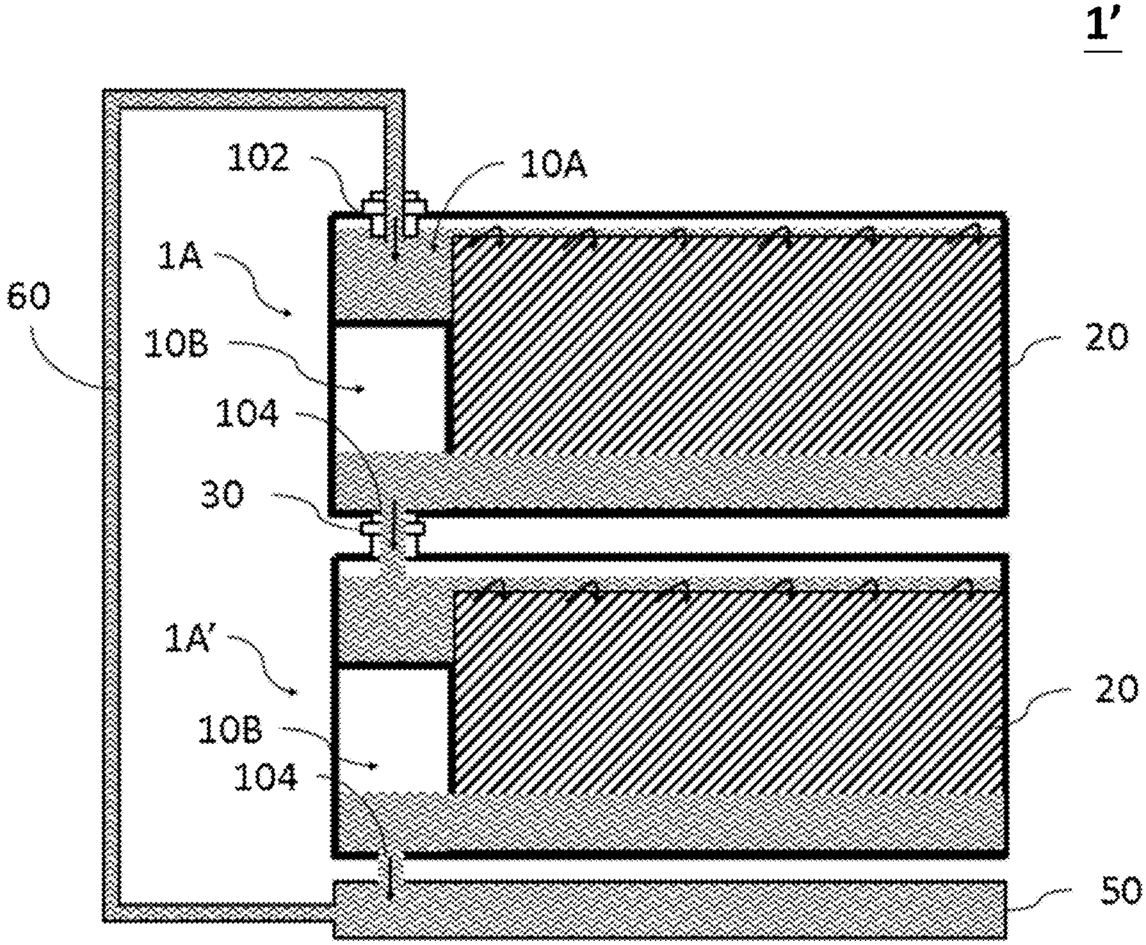
FIG. 5 is a schematic diagram illustrating a multilayered immersion cooling system according to a second embodiment of the present invention.

Please refer to FIG. 5. The multilayered immersion cooling system 1' further includes an inlet pipe 30, top covers (e.g., the top cover 40 in FIG. 2), a liquid reservoir 50, and a liquid channel 60. The inlet pipe 30 is connected between the two adjacent immersion cooling modules 1A and 1A'. The upper end of the inlet pipe 30 is connected to the liquid outlet 104 of the upper immersion cooling module 1A and the lower end of the inlet pipe 30 is connected to the liquid inlet 102. The inlet pipe 30 is configured to transport the cooling liquid into the liquid storage tank 10A. Please refer to FIG. 2 and FIG. 5. The top covers 40 are respectively arranged above the main tanks 10 and configured to shield at least one part of the liquid storage tank 10A or the temporary storage tank 10B. The inlet pipe 30 is arranged on the top covers 40.

As shown in FIG. 5, the liquid reservoir 50 is arranged under the immersion cooling module 1A', the liquid outlet 104 of the lower immersion cooling module 1A' faces the liquid reservoir 50 for the cooling liquid to flow in. The liquid channel 60 is arranged outside the immersion cooling modules 1A and 1A'. One end of the liquid channel 60 is connected to the liquid reservoir 50 and another end of the liquid channel 60 is connected to the liquid inlet 102 of the upper immersion cooling module 1A. The liquid channel 60 is used to guide the cooling liquid from bottom to the upper immersion cooling module 1A after the cooling liquid flows out from the liquid reservoir 50. Therefore, the embodiment ensure that the cooling liquid in the immersion cooling modules 1A and 1A' can continue circulating even without installing a driving device (i.e., a pump). Each immersion cooling module can retain the same volume of cooling liquid without receiving cooling liquid from the outside.

Figure 6:
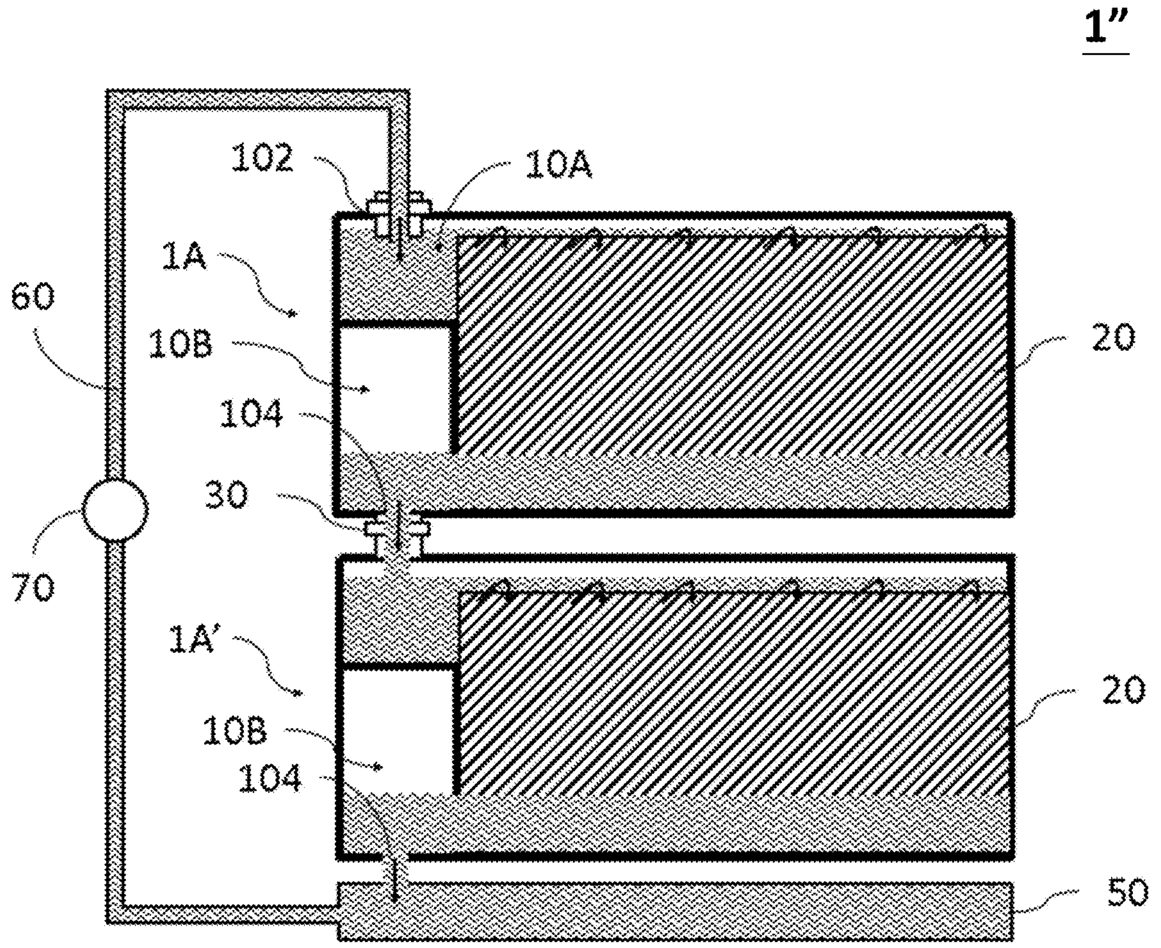
FIG. 6 is a schematic diagram illustrating a multilayered immersion cooling system according to a third embodiment of the present invention.

Please refer to FIG. 6. The multilayered immersion cooling system 1" of the embodiment is different from the multilayered immersion cooling system of FIG. 5 in a driving device 70. The multilayered immersion cooling system 1" of the embodiment includes the driving device 70 that is arranged outside the immersion cooling modules 1A and 1A'. The driving device 70 is connected to the liquid channel 60 and used to drive the cooling liquid to complete the circulation of the cooling liquid.

In each embodiment of the foregoing multilayered immersion cooling system, the cooling liquid can naturally dissipate heat to reduce the liquid temperature during the circulation process. When the cooling liquid with high temperature touches the surfaces of the immersion cooling module with low temperature, heat can be transferred from the cooling liquid to these surfaces to decrease the temperature of the cooling liquid. During the cooling liquid flows, the convection or radiation generated between the cooling liquid and the surrounding gas (such as air) can also dissipate heat and extend the heat exchanging process.

In some applications, in addition to the foregoing components, the multilayered immersion cooling system can also include a cooling device. The cooling device is located on the bottom or side of the liquid reservoir. The cooling device can be, but not limited to, an air conditioner, a heat exchanger/heat exchange plate, an ice water host, etc.

Figure 7A:
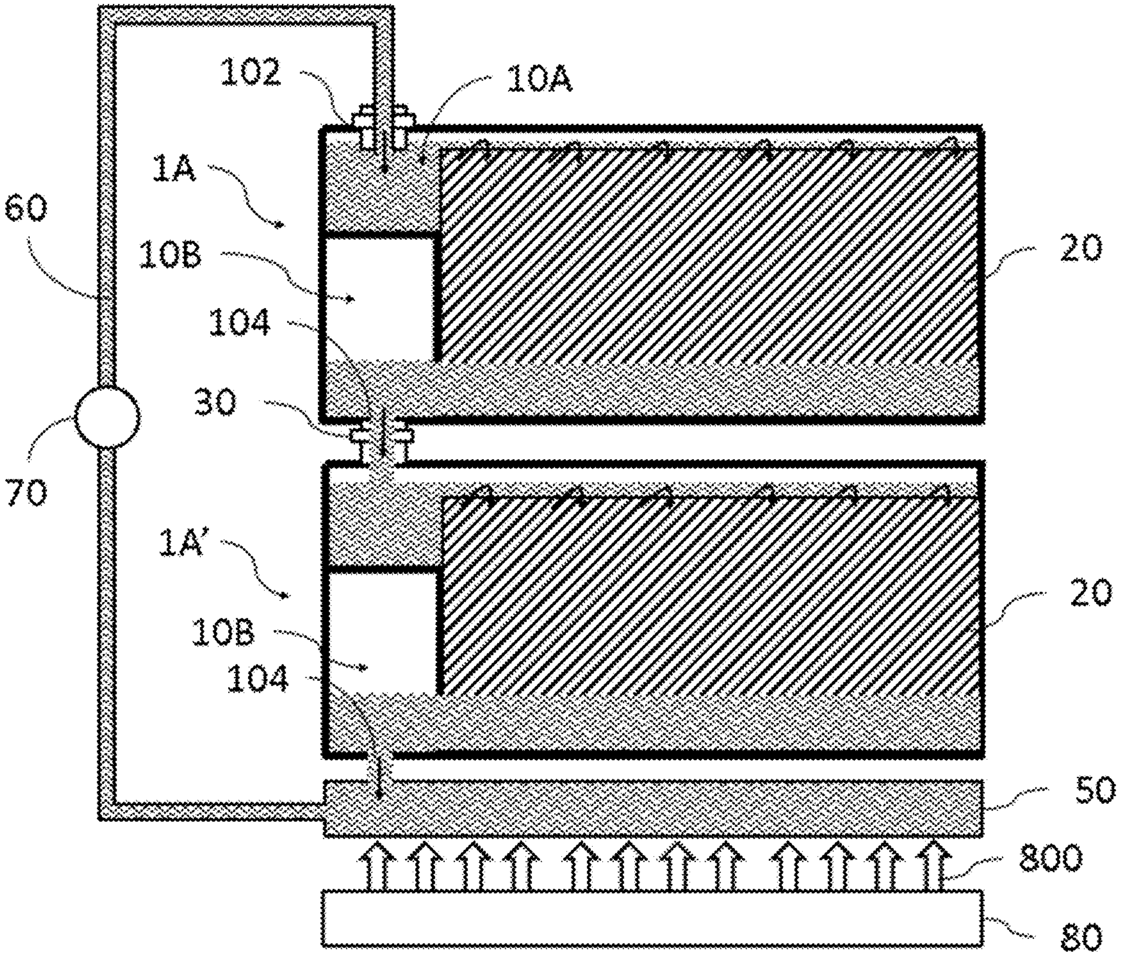
FIG. 7A and FIG. 7B are schematic diagrams illustrating the applications of a multilayered immersion cooling system according to an embodiment of the present invention.
Figure 7B:
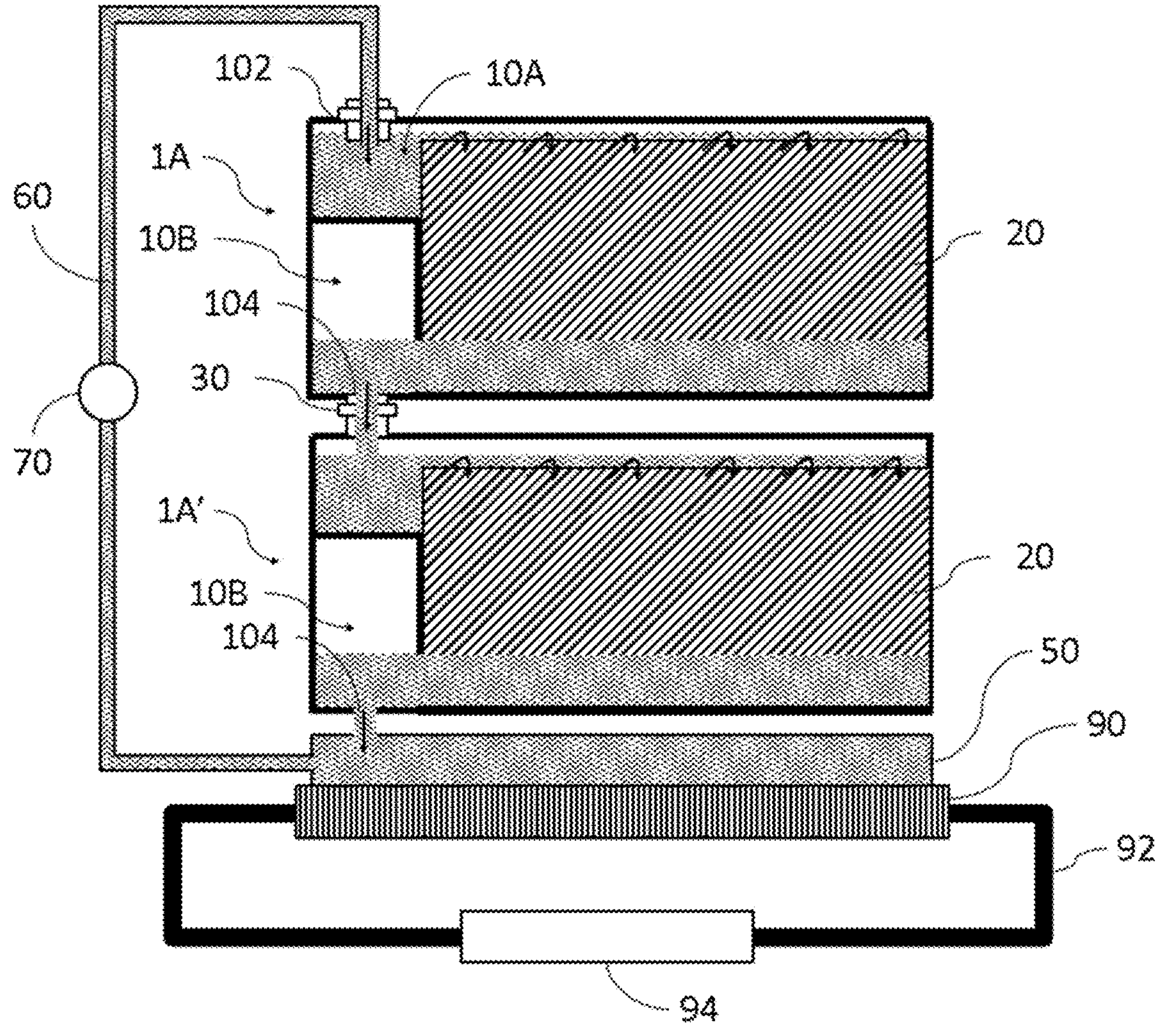

Refer to FIG. 7A and FIG. 7B. FIG. 7A and FIG. 7B are schematic diagrams illustrating the applications of a multilayered immersion cooling system 1". As shown in FIG. 7A, an air conditioner 80 is installed on the bottom or outside of the multilayered immersion cooling system 1". The air conditioner 80 outputs cold air 800 and the cold air 800 is directed toward the liquid reservoir 50. The temperature of the cooling liquid in the liquid reservoir 50 can be adjusted using the existing air cooling method. The cooled cooling liquid then flows into each immersion cooling module (i.e., immersion cooling modules 1A and 1A' in the drawing) through the liquid channel 60, and then changes the temperature of the immersion cooling modules 1A, 1A' one by one, so that the module to be cooled in each immersion cooling module can be cooled.

As shown in FIG. 7B, a heat exchange plate 90 is installed on the bottom or outside of the multilayered immersion cooling system 1". Both ends of the heat exchange plate 90 are connected to an ice water host 94 through pipes 92. When the cooling liquid in the lower immersion cooling module 1A' flows into the liquid reservoir 50, the heat of the cooling liquid in the liquid reservoir 50 can be transmitted to the ice water host 94 through the heat exchange plate 90. The ice water host 94 cools the cooling liquid in the liquid storage tank 50. Therefore, the cooled liquid flows out of the liquid storage tank 50 and flows into each immersion cooling module (i.e., the immersion cooling modules 1A and 1A' in the drawing) through the liquid channel 60, so that the module to be cooled in each immersion cooling module can achieve the temperature reduced and cooling effects.

The concept of the immersion cooling method of the multilayered immersion cooling system has also been explained in the process of explaining the multilayered immersion cooling system of the present invention. For the sake of clarity, the flowcharts of FIG. 8 and FIG. 9 are explained as follows.

Figure 8:
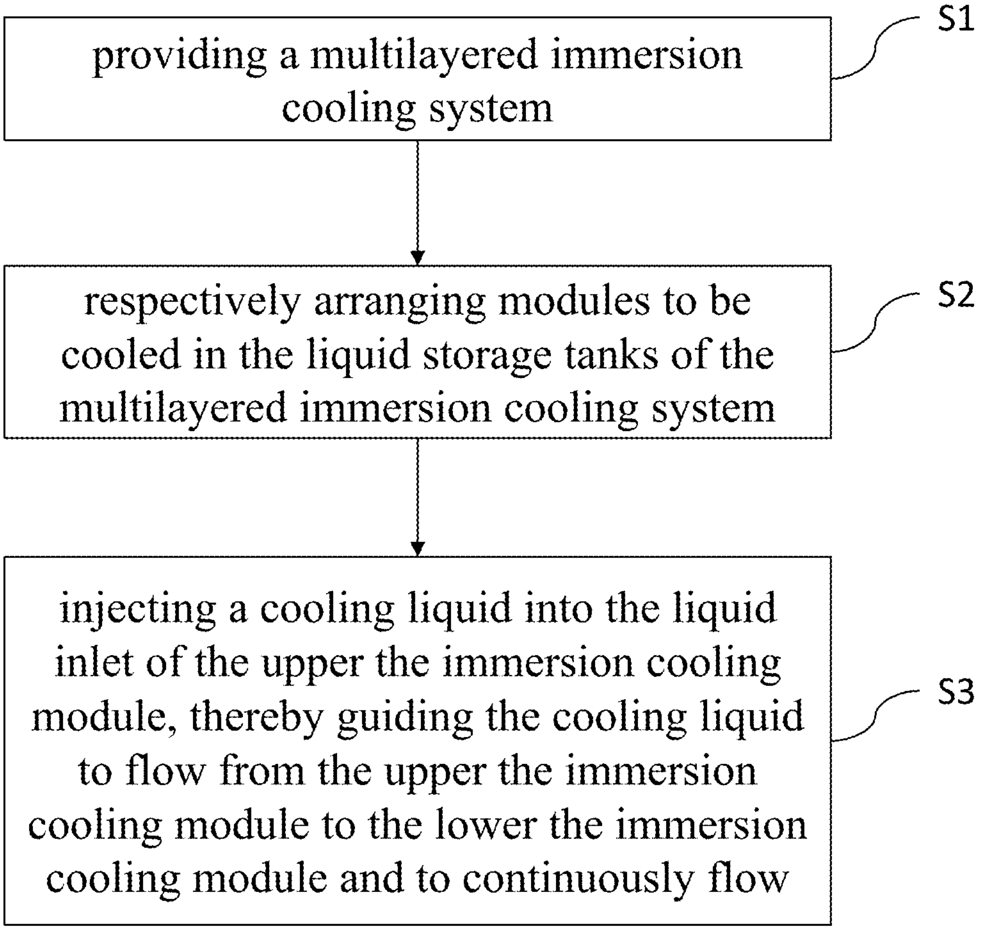
FIG. 8 is a flowchart 1 of an immersion cooling method according to an embodiment of the present invention.
Figure 9:
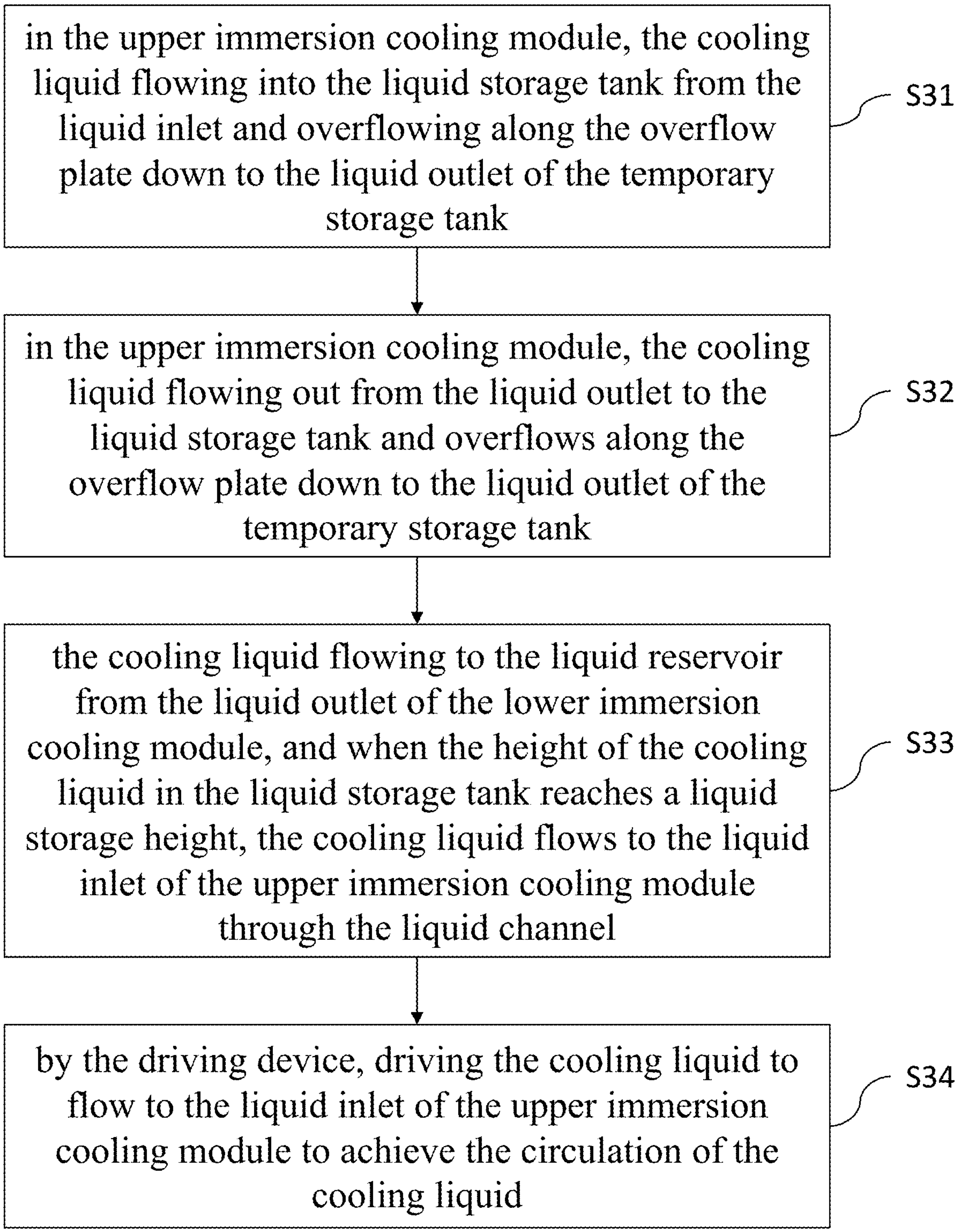
FIG. 9 is a flowchart 2 of an immersion cooling method according to an embodiment of the present invention.

Please refer to FIG. 8. The immersion cooling method that includes Steps S1~S3 is introduced as follows.

In Step S1, the multilayered immersion cooling system is provided, wherein the multilayered immersion cooling system includes the immersion cooling modules. The multilayered immersion cooling system and the immersion cooling module have been described previously so they will not be reiterated.

In Step S2, the modules to be cooled are respectively arranged in the liquid storage tanks of the multilayered immersion cooling system.

In Step S3, the cooling liquid is injected into the liquid inlet of the upper immersion cooling module, thereby guiding the cooling liquid to flow from the upper immersion cooling module to the lower immersion cooling module and to continuously flow.

Please refer to FIG. 9. Step S3 in the immersion cooling method includes Steps S31~S34.

In Step S31, the cooling liquid flows into the liquid storage tank from the liquid inlet and overflows along the overflow plate down to the liquid outlet of the temporary storage tank in the upper immersion cooling module.

In Step S32, the cooling liquid flows out from the liquid outlet of the upper immersion cooling module and then flows into the liquid inlet of the lower immersion cooling module. The cooling liquid flows into the liquid storage tank and overflows along the overflow plate down to the liquid outlet of the temporary storage tank.

In Step S33, the cooling liquid flows to the liquid reservoir from the liquid outlet of the lower immersion cooling module. When the height of the cooling liquid in the liquid storage tank reaches a liquid storage height, the cooling liquid flows to the liquid inlet of the upper immersion cooling module through the liquid channel.

In Step S34, the driving device drives the cooling liquid to flow to the liquid inlet of the upper immersion cooling module to achieve the circulation of the cooling liquid.

In Steps S31 and S32, when the top of the cooling liquid is higher than the top of the overflow plate in each of the immersion cooling modules, the cooling liquid overflows from the liquid storage tank to the temporary storage tank along the top of the overflow plate and finally discharges from the liquid outlet.

The foregoing embodiments exemplify two immersion cooling modules. In fact, those with ordinary knowledge in the art can easily implement three or more immersion cooling modules based on the description and drawings of the present invention.

The immersion cooling module, the multilayered immersion cooling system, and the method thereof have the following effects:

1. The present invention is widely applied to cooling electronic equipment, devices or modules of the same type or different types. Not limited to existing configurations, the present invention can be easily assembled and expanded to allow users to freely expand the number of modules according to requirements.
2. The present invention can improve maintenance efficiency and reduce costs. When a single module needs to be repaired, the present invention can simplify the maintenance process to reduce maintenance costs and improve work efficiency. In addition, when expanding the overall system, the architecture of the multilayered immersion cooling system can be quickly and easily assembled and expanded.
3. High circulation efficiency of cooling liquid: The design of the present invention allows the cooling liquid to circulate quickly and minimizes the pump power required for circulation, thereby improving cooling efficiency.
4. Convenient maintenance and expansion: It is especially suitable for cooling systems with multiple modules. A single module can be repaired and replaced independently without affecting the operation and cooling effect of other modules. It facilitates the maintenance and expansion of cooling space and improves the circulation efficiency of the cooling liquid.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. An immersion cooling module comprising:

a main tank with a tank bottom, a partition, a first sidewall, and a second sidewall, the first sidewall and the second sidewall are connected to the tank bottom, a bottom of the partition is connected to the tank bottom, the partition is connected to the first sidewall, the partition divides the main tank into a liquid storage tank and a temporary storage tank, a top of the liquid storage tank is provided with a liquid inlet, the liquid storage tank is configured to accommodate a cooling liquid and a module to be cooled, and a bottom of the temporary storage tank is provided with a liquid outlet; and an overflow plate arranged in the main tank, a bottom of the overflow plate is connected to the tank bottom, a side of the overflow plate is connected to the partition, another side of the overflow plate is connected to the second sidewall, and a height of the overflow plate is lower than a height of the partition;

wherein the liquid inlet is configured to inject the cooling liquid into the liquid storage tank, when a top of the cooling liquid is higher than a top of the overflow plate, the cooling liquid overflows from the liquid storage tank to the temporary storage tank along the top of the overflow plate, and finally discharges from the liquid outlet.

2. The immersion cooling module according to claim 1, further comprising an inlet pipe, wherein one end of the inlet pipe is connected to the liquid inlet, and the inlet pipe is configured to transport the cooling liquid into the liquid storage tank.

3. The immersion cooling module according to claim 2, further comprising a top cover arranged above the main tank and configured to shield a part of the liquid storage tank or the temporary storage tank, and the inlet pipe is arranged on the top cover.

4. The immersion cooling module according to claim 1, wherein the partition includes a bottom board, a first side board, and a second side board, the bottom board extends in a direction parallel to the tank bottom and connects to the first sidewall and the first side board, the first side board extends in a direction vertical to the tank bottom, one side of the first side board connects to the first sidewall, a bottom of the first side board connects to the bottom board, the second side board is adjacent to the first side board, the second side board extends in a direction vertical to the tank bottom, one side of the second side board connects to the first side board, and a bottom of the second side board connects to the tank bottom.

5. The immersion cooling module according to claim 1, wherein the liquid storage tank includes a first liquid storage region and a second liquid storage region that communicates with the first liquid storage region, the first liquid storage region communicates with the liquid inlet, the first liquid storage region is located over the temporary storage tank, and the first liquid storage region and the temporary storage tank are separated by the partition, the second liquid storage region is close to the overflow plate, and a bottom of the second liquid storage region is the tank bottom.

6. A multilayered immersion cooling system comprising:

a plurality of the immersion cooling modules of claim 1 stacked from bottom to top, wherein the main tanks respectively have an opening that face a same direction;

wherein the liquid outlet of an upper the immersion cooling module is connected to the liquid inlet of a lower the immersion cooling module, the cooling liquid flows from the upper the immersion cooling module to the lower the immersion cooling module, and the cooling liquid continuously flows.

7. The multilayered immersion cooling system according to claim 6, further comprising an inlet pipe connected between the two adjacent immersion cooling modules, wherein an upper end of the inlet pipe is connected to the liquid outlet of the upper the immersion cooling module, a lower end of the inlet pipe is connected to the liquid inlet, and the inlet pipe is configured to transport the cooling liquid into the liquid storage tank.

8. The multilayered immersion cooling system according to claim 7, further comprising top covers respectively arranged above the main tanks and configured to shield a part of the liquid storage tank or the temporary storage tank, and the inlet pipe is arranged on the top covers.

9. The multilayered immersion cooling system according to claim 6, wherein each of the partitions includes a bottom board, a first side board, and a second side board, the bottom board extends in a direction parallel to the tank bottom and connects to the first sidewall and the first side board, the first side board extends in a direction vertical to the tank bottom, one side of the first side board connects to the first sidewall, a bottom of the first side board connects to the bottom board, the second side board is adjacent to the first side board, the second side board extends in a direction vertical to the tank bottom, one side of the second side board connects to the first side board, and a bottom of the second side board connects to the tank bottom.

10. The multilayered immersion cooling system according to claim 6, wherein each of the liquid storage tanks includes a first liquid storage region and a second liquid storage region that communicates with the first liquid storage region, the first liquid storage region communicates with the liquid inlet, the first liquid storage region is located over the temporary storage tank, and the first liquid storage region and the temporary storage tank are separated by the partition, the second liquid storage region is close to the overflow plate, and a bottom of the second liquid storage region is the tank bottom.

11. The multilayered immersion cooling system according to claim 6, further comprising:

a liquid reservoir arranged under the plurality of the immersion cooling modules, the liquid outlet of the lower the immersion cooling module faces the liquid reservoir for the cooling liquid to flow in; and a liquid channel arranged outside each of the immersion cooling modules, one end of the liquid channel is connected to the liquid reservoir, and another end of the liquid channel is connected to the liquid inlet of the upper the immersion cooling module.

12. The multilayered immersion cooling system according to claim 11, further comprising a driving device arranged outside each of the immersion cooling modules, connected to the liquid channel, and configured to drive the cooling liquid to achieve circulation of the cooling liquid.

13. An immersion cooling method comprising:

providing the multilayered immersion cooling system of claim 6;

respectively arranging modules to be cooled in the liquid storage tanks of the multilayered immersion cooling system; and injecting a cooling liquid into the liquid inlet of the upper the immersion cooling module, thereby guiding the cooling liquid to flow from the upper the immersion cooling module to the lower the immersion cooling module and to continuously flow.

14. The immersion cooling method according to claim 13, further comprising:

in the upper the immersion cooling module, the cooling liquid flowing into the liquid storage tank from the liquid inlet and overflowing along the overflow plate down to the liquid outlet of the temporary storage tank; and the cooling liquid flowing out from the liquid outlet of the upper the immersion cooling module and then flowing into the liquid inlet of the lower the immersion cooling module, the cooling liquid flowing into the liquid storage tank and overflowing along the overflow plate down to the liquid outlet of the temporary storage tank, and each of the modules to be cooled submerged in the cooling liquid to generate flow of the cooling liquid.

15. The immersion cooling method according to claim 13, further comprising:

in each of the immersion cooling modules, when a top of the cooling liquid is higher than a top of the overflow plate, the cooling liquid overflows from the liquid storage tank to the temporary storage tank along the top of the overflow plate, and finally discharges from the liquid outlet.

16. The immersion cooling method according to claim 13, further comprising:

the cooling liquid flowing to a liquid reservoir from the liquid outlet of the lower the immersion cooling module, and when a height of the cooling liquid in the liquid storage tank reaches a liquid storage height, the cooling liquid flows to the liquid inlet of the upper the immersion cooling module through a liquid channel.

17. The immersion cooling method according to claim 16, further comprising:

by a driving device, driving the cooling liquid to flow to the liquid inlet of the upper the immersion cooling module to achieve circulation of the cooling liquid.

18. The immersion cooling method according to claim 13, wherein the multilayered immersion cooling system further comprising:

an inlet pipe connected between the two adjacent immersion cooling modules, wherein an upper end of the inlet pipe is connected to the liquid outlet of the upper the immersion cooling module, a lower end of the inlet pipe is connected to the liquid inlet, and the inlet pipe is configured to transport the cooling liquid into the liquid storage tank; and top covers respectively arranged above the main tanks and configured to shield a part of the liquid storage tank or the temporary storage tank, and the inlet pipe is arranged on the top covers.

19. The immersion cooling method according to claim 13, wherein each of the partitions includes a bottom board, a first side board, and a second side board, the bottom board extends in a direction parallel to the tank bottom and connects to the first sidewall and the first side board, the first side board extends in a direction vertical to the tank bottom, one side of the first side board connects to the first sidewall, a bottom of the first side board connects to the bottom board, the second side board is adjacent to the first side board, the second side board extends in a direction vertical to the tank bottom, one side of the second side board connects to the first side board, and a bottom of the second side board connects to the tank bottom.

20. The immersion cooling method according to claim 13, wherein each of the liquid storage tanks includes a first liquid storage region and a second liquid storage region that communicates with the first liquid storage region, the first liquid storage region communicates with the liquid inlet, the first liquid storage region is located over the temporary storage tank, and the first liquid storage region and the temporary storage tank are separated by the partition, the second liquid storage region is close to the overflow plate, and a bottom of the second liquid storage region is the tank bottom.

* * * * *